(12) United States Patent
Sarkar et al.

(10) Patent No.: US 11,444,243 B2
(45) Date of Patent: Sep. 13, 2022

(54) ELECTRONIC DEVICES COMPRISING METAL OXIDE MATERIALS AND RELATED METHODS AND SYSTEMS

(71) Applicant: Micron Technology, Inc., Boise, ID (US)

(72) Inventors: Santanu Sarkar, Boise, ID (US); Robert K. Grubbs, Boise, ID (US); Farrell M. Good, Meridian, ID (US); Adam W. Saxler, Boise, ID (US); Andrea Gotti, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/665,679

(22) Filed: Oct. 28, 2019

(65) Prior Publication Data
US 2021/0126193 A1 Apr. 29, 2021

(51) Int. Cl.
*H01L 45/00* (2006.01)
(52) U.S. Cl.
CPC .......... *H01L 45/145* (2013.01); *H01L 45/141* (2013.01); *H01L 45/149* (2013.01); *H01L 45/1616* (2013.01)
(58) Field of Classification Search
CPC . H01L 45/145; H01L 45/1616; H01L 45/141; H01L 45/149; H01L 27/115–11597; H01L 29/42324–42336; H01L 29/788–7889; H01L 27/10–1028; G11C 16/04–0491; G11C 16/06–3495; G11C 2216/06–10
See application file for complete search history.

(56) References Cited

U.S. PATENT DOCUMENTS

| | | | |
|---|---|---|---|
| 9,054,308 B1 | 6/2015 | Zhang et al. |
| 9,484,196 B2 | 11/2016 | Song et al. |
| 9,768,378 B2 | 9/2017 | Pellizzer et al. |
| 9,793,110 B2 | 10/2017 | Kang et al. |
| 9,812,338 B2 | 11/2017 | Ring et al. |
| 9,978,810 B2 | 5/2018 | Pellizzer |

(Continued)

FOREIGN PATENT DOCUMENTS

| | | |
|---|---|---|
| KR | 10-2010-0110630 A | 10/2010 |
| TW | 201145497 A | 12/2011 |

OTHER PUBLICATIONS

International Search Report for Application No. PCT/US2020/054492, dated Jan. 29, 2021, 4 pages.

(Continued)

*Primary Examiner* — Shahed Ahmed
(74) *Attorney, Agent, or Firm* — TraskBritt

(57) ABSTRACT

An electronic device comprising a stack structure comprising one or more stacks of materials and a metal oxide material adjacent to the stacks of materials. The materials of the stacks comprise one or more chalcogenide materials. The metal oxide material comprises aluminum oxide, aluminum silicate, hafnium oxide, hafnium silicate, zirconium oxide, zirconium silicate, or a combination thereof and the metal oxide material extends continuously from an upper portion of the one or more stacks of materials to a lower portion of the one or more stacks of materials. Additional electronic devices are disclosed, as are related systems and methods of forming an electronic device.

22 Claims, 6 Drawing Sheets

(56) References Cited

U.S. PATENT DOCUMENTS

| | | | |
|---|---|---|---|
| 10,043,657 B2 | 8/2018 | Swaminathan et al. | |
| 10,128,437 B1 | 11/2018 | Fantini et al. | |
| 10,256,406 B2 | 4/2019 | Collins et al. | |
| 10,276,677 B2 | 4/2019 | Huang et al. | |
| 10,319,588 B2 | 6/2019 | Mattinen et al. | |
| 10,361,076 B2 | 7/2019 | Kang et al. | |
| 2011/0077152 A1* | 3/2011 | Gerdes | B01J 35/1038 |
| | | | 502/439 |
| 2013/0062590 A1* | 3/2013 | Sonehara | H01L 27/2481 |
| | | | 257/5 |
| 2015/0287916 A1* | 10/2015 | Campbell | H01L 45/1675 |
| | | | 257/5 |
| 2017/0250225 A1 | 8/2017 | Kang et al. | |
| 2017/0365642 A1 | 12/2017 | Ravasio et al. | |
| 2018/0033825 A1 | 2/2018 | Apodaca et al. | |
| 2018/0218940 A1 | 8/2018 | King et al. | |
| 2018/0350837 A1* | 12/2018 | Yoo | H01L 27/11504 |
| 2019/0051826 A1 | 2/2019 | Omstead et al. | |
| 2019/0165263 A1 | 5/2019 | Hansen et al. | |
| 2019/0386213 A1* | 12/2019 | Lai | H01L 27/2481 |
| 2020/0287129 A1* | 9/2020 | Sarkar | H01L 27/2427 |
| 2021/0057223 A1* | 2/2021 | Stevens | H01L 27/10891 |

OTHER PUBLICATIONS

Written Opinion of the International Searching Authority for Application No. PCT/US2020/054492, dated Jan. 29, 2021, 4 pages.

Taiwanese First Office Action for Application No. 109134716, dated Aug. 4, 2021, 21 pages.

Taiwanese Rejection Decision for Application No. 109134716, dated Mar. 9, 2022, 8 pages.

\* cited by examiner

ELECTRONIC DEVICES COMPRISING METAL OXIDE MATERIALS AND RELATED METHODS AND SYSTEMS

TECHNICAL FIELD

Embodiments disclosed herein relate to electronic devices and electronic device fabrication. More particularly, embodiments of the disclosure relate to electronic devices comprising seal materials having improved barrier properties and to related methods and systems.

BACKGROUND

Electronic device (e.g., semiconductor device, memory device) designers often desire to increase the level of integration or density of features (e.g., components) within an electronic device by reducing the dimensions of the individual features and by reducing the separation distance between neighboring features. Electronic device designers also desire to design architectures that are not only compact, but offer performance advantages, as well as simplified designs. Reducing the dimensions and spacing of features has placed increasing demands on the methods used to form the electronic devices. One solution has been to form three-dimensional (3D) electronic devices, such as 3D cross-point memory devices, in which the features are arranged vertically rather than horizontally. To form the features, multiple materials are positioned over one another and are etched to form stacks of the materials. The materials include chalcogenide materials and electrode materials. Some of the materials of the stacks are sensitive to subsequently conducted process acts, such as to process temperatures or etch conditions of the subsequent process acts. The materials of the stacks may, for example, be thermally sensitive or sensitive to etch chemistries and process conditions. The process temperatures to which the materials of the stacks are exposed range between 275° C. and 375° C. and temperatures within this range oxidize or otherwise damage the sensitive materials.

To protect the materials of the stacks, a seal material has been formed over the stacks. The seal material includes silicon nitride (SiN) in combination with silicon oxide ($SiO_x$). When used as a seal material, the SiN is conventionally formed by a plasma enhanced chemical vapor deposition (PECVD) process and the $SiO_x$ is conventionally formed over the SiN by a plasma enhanced atomic layer deposition (PEALD) process. However, when the PECVD SiN/PEALD $SiO_x$ seal material is formed at a sufficient thickness to provide the desired protective properties, the process conditions of the PECVD and PEALD processes damage the sensitive materials of the stacks. The SiN also does not uniformly cover sidewalls of the stacks to sufficiently protect the materials of the stacks. Additionally, when the conventional PECVD SiN/PEALD $SiO_x$ seal material is formed over the stacks, spacing between the adjacent stacks decreases and forms a bottleneck or pinch off, causing a so-called "bread loafing" effect to occur between upper portions of the adjacent stacks. The formation of the PECVD SiN/PEALD $SiO_x$ seal material also increases the aspect ratio of the stacks due to the thickness at which the conventional PECVD SiN/PEALD $SiO_x$ seal material are formed to provide sufficient barrier properties. If, however, the PECVD SiN/PEALD $SiO_x$ seal material is formed at a lower thickness, the PECVD SiN/PEALD $SiO_x$ seal material does not provide sufficient barrier performance and sidewall coverage. When a dielectric material is subsequently formed between the adjacent stacks, the bottlenecked portion of the PECVD SiN/PEALD $SiO_x$ seal material prevents the dielectric material from completely filling openings between the stacks and forms voids in the dielectric material. Since aspect ratios of features continue to increase and spacing between adjacent features continues to decrease with increasing memory density, the conventional PECVD SiN/PEALD $SiO_x$ seal material does not provide sufficient barrier properties and causes bread loafing due to the reduced distance between the adjacent stacks.

DETAILED DESCRIPTION

Figure 1A:
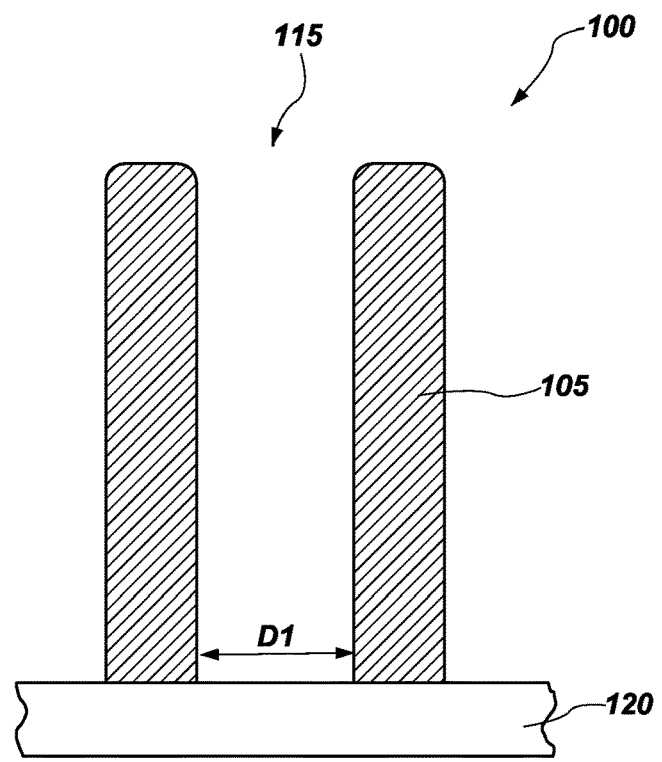
FIGS. 1A-4 are cross-sectional views of stack structures and various stages of forming the stack structures according to embodiments of the disclosure.

An electronic device (e.g., an apparatus, a semiconductor device, a memory device) that includes a seal material or a seal structure adjacent to (e.g., over) stacks of materials is disclosed. The stacks include one or more thermally sensitive materials or one or more oxidation sensitive materials. The seal material or seal structure is formed over materials of the stacks to protect sensitive materials during subsequent process acts. The seal material may be a metal oxide material, and the seal structure may include multiple materials, such as the seal material (e.g., the metal oxide material) and a silicon nitride material. The seal material may, therefore, include one (e.g., a single) material while the seal structure includes two or more materials. The seal material is formed by a process that produces a highly conformal metal oxide material adjacent to (e.g., on) materials of the stacks. The seal material is formed by a less aggressive ALD process compared to conventional techniques of forming the silicon nitride and silicon oxide of conventional PECVD SiN/PEALD $SiO_x$ seal materials. The seal material is formed, for example, on sidewalls of the stacks at a sub uniform thickness and at a sufficient step coverage to prevent damage to the materials of the stacks caused by subsequent process acts. When a fill material is formed within openings defined by sidewalls of the seal material, the fill material is substantially void free. The seal material is formed on the stacks at a thickness sufficient to provide barrier properties without forming so-called "bottlenecks," "pinch offs," or "bread-loafing" between adjacent stacks. The seal material provides comparable or increased barrier properties at a decreased thickness compared to that achieved by the same thickness of a conventional PECVD SiN/PEALD $SiO_x$ seal material. Therefore, the seal material according to embodiments of the disclosure provides comparable or increased barrier properties per unit thickness of seal material.

The following description provides specific details, such as material types, material thicknesses, and process conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of an electronic device or a complete process flow for manufacturing the electronic device and the structures described below do not form a complete electronic device. Only those process acts and structures necessary to understand the embodiments described herein are described in detail below. Additional acts to form a complete electronic device may be performed by conventional techniques.

Unless otherwise indicated, the materials described herein may be formed by conventional techniques including, but not limited to, spin coating, blanket coating, chemical vapor deposition ("CVD"), atomic layer deposition ("ALD"), plasma enhanced ALD, physical vapor deposition ("PVD") (including sputtering, evaporation, ionized PVD, and/or plasma-enhanced CVD), or epitaxial growth. Alternatively, the materials may be grown in situ. Depending on the specific material to be formed, the technique for depositing or growing the material may be selected by a person of ordinary skill in the art. The removal of materials may be accomplished by any suitable technique including, but not limited to, etching (e.g., dry etching, wet etching, vapor etching), ion milling, abrasive planarization (e.g., chemical-mechanical planarization), or other known methods unless the context indicates otherwise.

Drawings presented herein are for illustrative purposes only, and are not meant to be actual views of any particular material, component, structure, device, or electronic system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, "and/or" includes any and all combinations of one or more of the associated listed items.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the term "configured" refers to a size, shape, material composition, and arrangement of one or more of at least one structure and at least one apparatus facilitating operation of one or more of the structure and the apparatus in a pre-determined way.

As used herein, the term "electronic device" includes, without limitation, a memory device, as well as semiconductor devices which may or may not incorporate memory, such as a logic device, a processor device, or a radiofrequency (RF) device. Further, an electronic device may incorporate memory in addition to other functions such as, for example, a so-called "system on a chip" (SoC) including a processor and memory, or an electronic device including logic and memory. The electronic device may be a 3D electronic device, such as a 3D cross-point memory device, that includes sensitive materials.

As used herein, reference to an element as being "on" or "over" another element means and includes the element being directly on top of, adjacent to (e.g., laterally adjacent to, vertically adjacent to), underneath, or in direct contact with the other element. It also includes the element being indirectly on top of, adjacent to (e.g., laterally adjacent to, vertically adjacent to), underneath, or near the other element, with other elements present therebetween. In contrast, when an element is referred to as being "directly on" or "directly adjacent to" another element, no intervening elements are present.

As used herein, the term "metal oxide material" means and includes a material including metal atoms and oxygen atoms, and optionally includes silicon atoms. The metal oxide material has a general chemical formula of $MO_x$ (a metal oxide) or $MSiO_x$ (a metal silicate), where M is aluminum or a transition metal. The term "metal oxide" is used to refer to the material having the general chemical formula of $MO_x$ and the term "metal silicate" is used to refer to the material having the general chemical formula of $MSiO_x$. The term "metal oxide material" is used to collectively refer to the metal oxide and metal silicate. Since silicon is not a metal, silicon oxide is not included (e.g., is excluded) as the metal oxide material of the seal material or of the seal structure.

As used herein, the term "seal material" means and includes a material formulated to exhibit barrier properties, such as reducing or substantially preventing water from passing through the material.

As used herein, the term "seal structure" means and includes multiple materials positioned adjacent to one another and that are formulated to exhibit barrier properties, such as including the seal material and one or more additional materials.

The term "seal" is used to collectively refer to the seal material and the seal structure.

As used herein, the term "selectively etchable" means and includes a material that exhibits a greater etch rate responsive to exposure to a given etch chemistry and/or process conditions relative to another material exposed to the same etch chemistry and/or process conditions. For example, the material may exhibit an etch rate that is at least about five times greater than the etch rate of another material, such as an etch rate of about ten times greater, about twenty times greater, or about forty times greater than the etch rate of the another material. Etch chemistries and etch conditions for selectively etching a desired material may be selected by a person of ordinary skill in the art.

As used herein, the term "stack" means and includes a feature having multiple materials positioned vertically adjacent to one another. At least one of the materials of the stack may be sensitive to heat or to water. The materials of the stacks may include one or more conductive (e.g., electrically conductive) material, one or more chalcogenide material, and a hardmask material, or a combination thereof.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "substrate" means and includes a material (e.g., a base material) or construction upon which additional materials are formed. The substrate may be a an electronic substrate, a semiconductor substrate, a base semiconductor layer on a supporting structure, an electrode, an electronic substrate having one or more materials, layers, structures, or regions formed thereon, or a semiconductor substrate having one or more materials, layers, structures, or regions formed thereon. The materials on the electronic substrate or semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOT") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

Figure 1B:
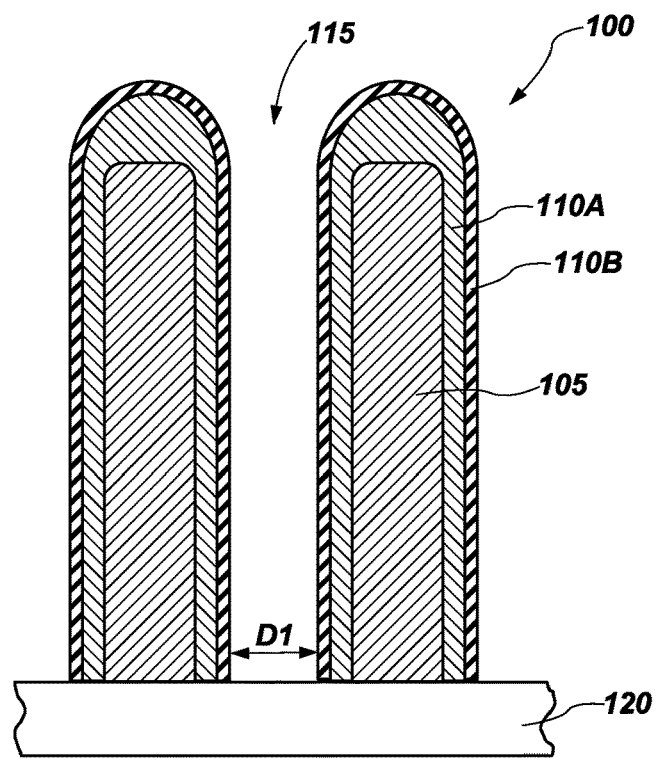

Stack structures 100 including stacks 105, optional liners 110A, 110B adjacent to (e.g., over) the stacks 105, and openings 115 are shown in FIGS. 1A and 1B. The stack structure 100 is formed adjacent to (e.g., on) a substrate 120. The stacks 105 are separated from one another by the openings 115. Each stack 105 includes multiple materials, such as one or more conductive materials, one or more chalcogenide materials, and a hardmask material. One or more of the materials of the stacks 105 may be heat sensitive or sensitive to oxidation. The stacks 105 may, for instance, include one or more conductive materials, one or more chalcogenide materials, one or more conductive carbon materials, and the hardmask material. By way of example only, the stacks 105 may include the conductive material over the substrate, a first conductive carbon material over the conductive material, one or more chalcogenide materials over the first conductive carbon material, a second conductive carbon material over the one or more chalcogenide materials, and the hardmask material over the second conductive carbon material. The stacks 105 may, for example, include one or more chalcogenide materials and one or more conductive carbon materials, which are sensitive to heat or to oxidation (e.g., oxidative conditions), to which conditions the materials may be exposed during and following the formation of the stacks 105 or during formation of a seal material 125 (see FIGS. 2A and 2B). For instance, the carbon and chalcogenide materials of the stacks 105 may become oxidized or otherwise damaged when exposed to water or to process conditions used to form the stacks 105, the liners 110A, 110B (if present), or the seal material 125.

The conductive material of the stacks 105 may include an electrically conductive material including, but not limited to, tungsten, aluminum, copper, titanium, tantalum, platinum, alloys thereof, heavily doped semiconductor material, polysilicon, a conductive silicide, a conductive nitride, a conductive carbon, a conductive carbide, or combinations thereof. The conductive material may, for example, be configured as an access line, a word line, a contact, a digit line, a bit line, etc. in some such embodiments, the conductive material is tungsten. The conductive material may alternatively be configured as an electrode. In some such embodiments, the conductive material is conductive carbon.

The chalcogenide material of the stacks 105 may be a chalcogenide glass, a chalcogenide-metal ion glass, or other chalcogenide-containing material. The chalcogenide material may be a binary or multinary (ternary, quaternary, etc.) compound including at least one chalcogenide atom and at least one more electropositive element. As used herein, the term "chalcogenide" means and includes an element of Group VI of the Periodic Table, such as oxygen (O), sulfur (S), selenium (Se), or tellurium (Te). The electropositive element may include, but is not necessarily limited to, nitrogen (N), silicon (Si), nickel (Ni), gallium (Ga), germanium (Ge), arsenic (As), silver (Ag), indium (In), tin (Sn), antimony (Sb), gold (Au), lead (Pb), bismuth (Bi), or combinations thereof. By way of example only, the chalcogenide material may include a compound including Ge, Sb, and Te (i.e., a GST compound), such as $Ge_2Sb_2Te_5$, however, the disclosure is not so limited and the chalcogenide material may include other compounds including at least one chalcogenide element. The chalcogenide material may be doped or undoped and may have metal ions mixed therein. By way of example only, the chalcogenide material may be an alloy including indium, selenium, tellurium, antimony, arsenic, bismuth, germanium, oxygen, tin, or combinations thereof. In some embodiments, the stack 105 includes one (e.g., a single) chalcogenide material. In other embodiments, the stack 105 includes two chalcogenide materials.

The hardmask material of the stacks 105 may exhibit a different etch selectivity relative to other materials in the stacks 105 and relative to another conductive material formed on the stacks 105 during subsequent process acts. The hardmask material may include, but is not limited to, silicon nitride or amorphous carbon. The hardmask material may be removed before conducting subsequent process acts. In some embodiments, the hardmask material is silicon nitride.

The materials of the stacks 105 may be positioned adjacent to (e.g., vertically adjacent to) one another. However, for simplicity, the materials of the stacks 105 are shown as a single material in FIGS. 1A-4. The materials of the stacks 105 may be formed vertically adjacent to one another by conventional techniques and the materials patterned to form the stacks 105 separated from one another by the openings 115. The materials may be patterned (e.g., a portion of the materials removed) by conventional techniques, such as by etching the materials using conventional photolithography techniques. The materials may, for example, be exposed to an anisotropic etch process, such as a dry plasma etch process or a reactive ion etch process, to form the stacks 105. Conventional etch chemistries and etch conditions may be used to form the stacks 105 and the openings 115. The stacks 105 may be high aspect ratio (HAR) features having an aspect ratio (i.e., a ratio of width to depth) of greater than or equal to about 5:1, such as from about 5:1 to about 100:1, from about 5:1 to about 50:1, from about 10:1 to about 40:1, from about 10:1 to about 30:1, from about 10:1 to about 20:1, from about 20:1 to about 50:1, from about 20:1 to about 40:1, or from about 20:1 to about 30:1. The openings 115 may also exhibit a high aspect ratio. The stacks 105 may be formed at a half pitch of from about 3 nm to about 100 nm, such as from about 10 nm to about 30 nm, from about 15 nm to about 25 nm or from about from about 15 nm to about 20 nm. In some embodiments, the stacks 105 are formed at a half pitch of 20 nm. In other embodiments, the stacks 105 are formed at a half pitch of 14 nm. In addition to the stacks 105 being configured as lines, other geometries, such as pillars, may be used.

The liners 110A, 110B, if present, may be formed adjacent to (e.g., over) the stacks 105, as shown in FIG. 1B. The liners 110A, 110B may be conformally formed of dielectric materials by conventional techniques. The liners 110A, 110B are formed on sidewalls of the stacks 105 at a thickness sufficient to protect the materials of the stacks 105 during process acts conducted before or after the seal material 125 (see FIGS. 2A and 2B) is formed, such as an etch process (e.g., a dry etch process, a wet etch process) or a plasma-based process, such as a densification process. The liners 110A, 110B may also protect the materials of the stacks 105 during process acts conducted to clean the stacks 105. By way of example only, a portion of a first conductive material, such as tungsten, of the stacks 105 may be removed following initial patterning of overlying materials of the stacks 105. At least a portion of the liners 110A, 110B, may be removed during the patterning of the first conductive material. For instance, during the patterning of the first conductive material, a portion of the liners 110A, 110B on sidewalls of the stacks 105 may be removed while another portion of the liners 110A, 110B may remain on the sidewalls of the stacks 105. The etch chemistry and etch conditions may, for example, remove the portion of the liners 110A, 110B from the sidewalls of the conductive materials while the liners 110A, 110B remain on the sidewalls of the chalcogenide materials or the hardmask material. While FIG. 1B shows the liners 110A, 110B as being substantially continuous materials, the liners 110A, 110B may, in fact, become discontinuous during the patterning of the first conductive material due to the etch chemistry and etch conditions used.

As shown in FIGS. 1A and 1B, adjacent stacks 105 of the stack structure 100 are separated from one another by a distance D1. The distance D1 may range from about 3 nm to about 300 nm, such as from about 20 nm to about 60 nm, from about 20 nm to about 40 nm, or from about 40 nm to about 60 nm depending on a pitch at which the stacks 105 of the stack structure 100 are formed, a thickness of the optional liners 110A, 110B, and whether all or a portion of the optional liners 110A, 110B is removed. The pitch of the stacks 105 may be selected depending on the intended use of the stack structure 100 in the electronic device containing the stack structure 100. As described in more detail below, the stack structure 100 may be present in memory cells of the electronic device.

Figure 2A:
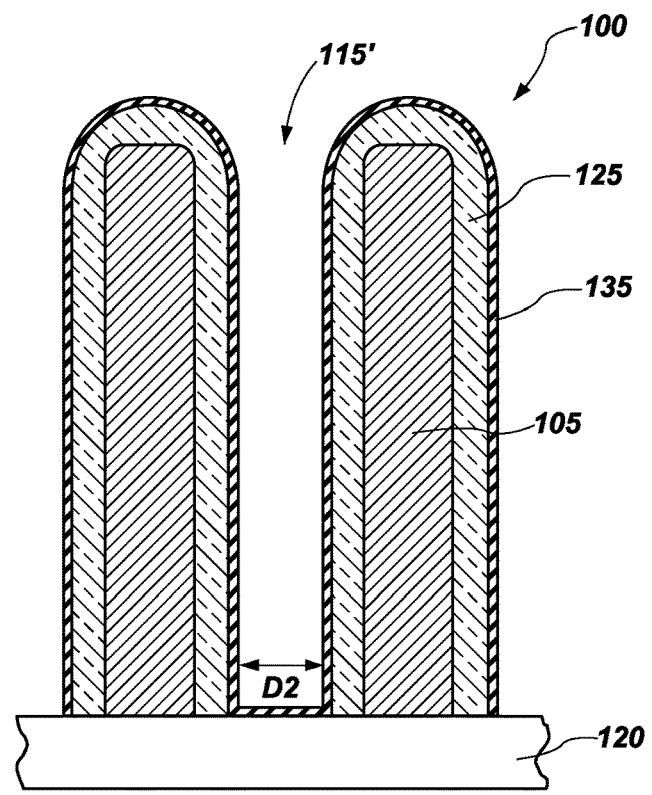
Figure 2B:
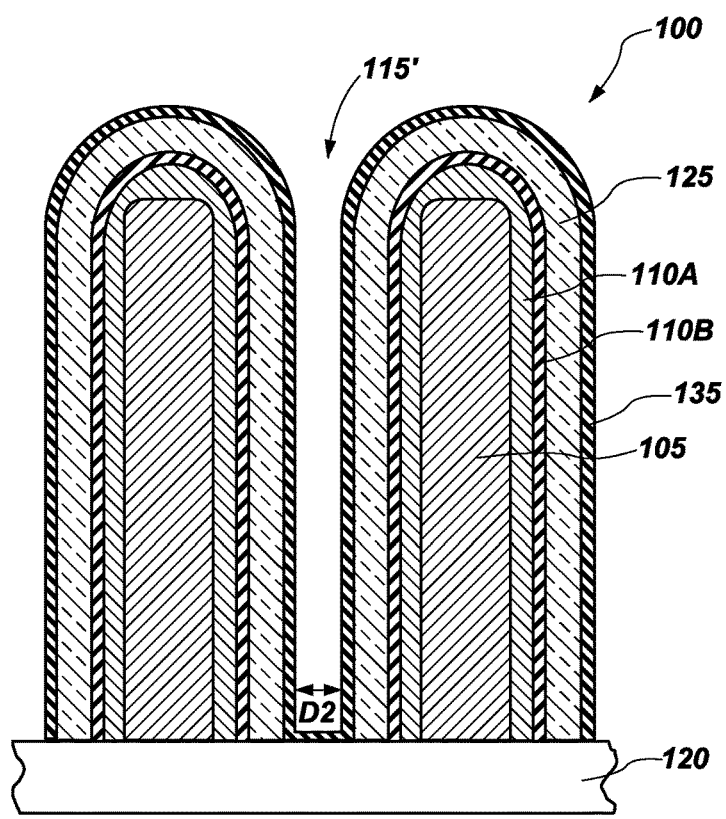

A seal material 125 is formed adjacent to (e.g., over) the materials of the stacks 105 of the stack structure 100 as shown in FIG. 2A. Alternatively, the seal material 125 may be formed over the liners 110A, 110B, as shown in FIG. 2B, if all or a portion of the liners 110A, 110B is present. The seal material 125 may substantially encapsulate the materials of the stacks 105. The metal oxide material (e.g., the metal oxide, metal silicate) of the seal material 125 may be selected to be selectively etchable relative to a conductive material subsequently formed over the stacks 105, a portion of which is removed by a later process act to form, for example, a bit line. The seal material 125 may substantially surround (e.g., encapsulate) the stacks 105 and the liners 110A, 110B, if present, such as over top surfaces and sidewalls thereof. The seal material 125 may be present on three surfaces of the stacks 105, providing a hermetic barrier that prevents water from passing through the seal material 125 and into the stacks 105. The seal material 125 may directly contact the liners 110A, 110B, if present, or may directly contact the stacks 105. Subsequent drawings illustrate the seal material 125 in direct contact with the stacks 105. However, the liners 110A, 110B, if present, may intervene between the seal material 125 and the stacks 105.

The seal material 125 may be formed at a sufficient thickness to protect the materials of the stacks 105 and the liners 110A, 110B, if present, from subsequent process acts, which may oxidize or otherwise damage the materials of the stacks 105 if the materials were to remain exposed during the subsequent process acts. The seal material 125 may also provide protection during use and operation of an electronic device containing the seal material 125, such as when high temperatures and electrical fields may be present. The seal material 125 may be formed at a minimum thickness sufficient to provide the desired barrier properties without forming bottlenecks or bread loafing around upper portions of the stacks 105 when a fill material 140 (see FIG. 3) is formed between the stacks 105. The thickness of the seal material 125 may range from about 1.0 nm to about 5.0 nm, such as from about 1.0 nm to about 2.0 nm, from about 1.0 nm to about 2.5 nm, from about 1.0 nm to about 3.0 nm, or from about 1.0 nm to about 4.0 nm. In some embodiments, the thickness of the seal material 125 is from about 1.0 nm to about 2.5 nm. The seal material 125 may exhibit comparable or increased barrier properties at a lower thickness relative to the barrier properties and thickness of the PECVD SiN/PEALD $SiO_x$ used as the conventional seal material. The seal material 125, therefore, provides comparable or increased barrier properties per unit seal thickness relative to the conventional PECVD SiN/PEALD SiO$_x$ seal material.

The seal material 125 may be conformally formed over the stacks 105 and may form a substantially continuous material over sidewalls and the upper portion of the stacks 105. The seal material 125 may be substantially free of pinholes or other discontinuities. The seal material 125 may be formed in the openings 115, which are defined by the sidewalls of the stacks 105 or the sidewalls of the liner 110B, if present. The seal material 125 may be formed on (e.g., adjacent to) the stacks 105 or the liner 110B, reducing the size of the openings 115 to openings 115'. After forming the seal material 125, the stacks 105 are separated from one another by a distance D2, which is less than the distance D1. The distance D2 may be sufficient for a fill material 140 (see FIG. 4) to be formed in the openings 115' without voids forming in the fill material 140. The seal material 125 may exhibit a high degree of conformality and a high degree of thickness uniformity (e.g., a high step coverage), reducing or eliminating bottlenecks and so-called "bread loafing" between the stacks 105. Since sufficient space remains between the stacks 105 after forming the seal material 125, substantially no bottlenecks or bread loafing occur at or between the upper portions of the stacks 105. The seal material 125 may exhibit a conformality of at least about 95%, such as greater than about 98% or greater than about 99%. The thickness coverage (e.g., a ratio of the thickness of the seal material 125 on the sidewalls to the thickness of the seal material 125 on the upper portions) of the seal material 125 may be about 1:1. Therefore, the seal material 125 according to embodiments of the disclosure enables the stacks 105 to be formed closer together without bottlenecks or "bread loafing" occurring between the adjacent stacks 105.

The seal material 125 may, for example, be a metal oxide or a metal silicate. The metal oxide may be aluminum oxide or a transition metal oxide, including, but not limited to, hafnium oxide or zirconium oxide. However, the transition metal may exclude titanium. The metal oxide may also include one or more of aluminum and a transition metal. i.e., a mixed metal oxide, such as aluminum hafnium oxide, aluminum zirconium oxide, or hafnium zirconium oxide. The mixed metal oxide may include the oxygen in an amount of from about 5 atomic percent to about 50 atomic percent. The metal silicate may be aluminum silicate or a transition metal silicate, including, but not limited to, hafnium silicate or zirconium silicate. The metal silicate may also include one or more of aluminum and a transition metal, i.e., a mixed metal silicate, such as aluminum hafnium silicate, aluminum zirconium silicate, or hafnium zirconium silicate. The metal silicate may be a stoichiometric compound or a non-stoichiometric compound, such as a silicon-doped metal oxide or an alloy of the metal oxide and silicon oxide. An amount of silicon in the metal silicate may range from about 5 atomic percent to about 80 atomic percent relative to the metal of the metal silicate, such as from about 10 atomic percent to about 80 atomic percent, from about 20 atomic percent to about 50 atomic percent, from about 20 atomic percent to about 40 atomic percent, from about 20 atomic percent to about 30 atomic percent, from about 50 atomic percent to about 80 atomic percent, from about 60 atomic percent to about 50 atomic percent, or from about 70 atomic percent to about 80 atomic percent. The metal oxide material of the seal material 125 may be substantially homogeneous in composition across a thickness thereof. By appropriately selecting the metal of the seal material 125, loss of the chalcogenide material in the stacks 105 may be minimized. By way of example only, if the metal of the seal material 125 is hafnium, a lower loss of chalcogenide material from the stacks 105 may be observed than if the metal of the seal material 125 is aluminum. Without being bound by any theory, the lower loss of the chalcogenide material may be due to thermochemical interaction of a metal precursor with other materials. The seal material 125 may, alternatively, be a metal nitride or a mixed metal nitride, such as aluminum nitride or a transition metal nitride. By way of example only, the metal nitride may be aluminum nitride, hafnium nitride, zirconium nitride, aluminum hafnium nitride, aluminum zirconium nitride, or hafnium zirconium nitride.

The metal oxide material (e.g., the metal oxide or the metal silicate) of the seal material 125 may be selected depending on an etch rate selectivity of the seal material 125 compared to other exposed materials, such as the hardmask material or another conductive material, during later process acts. The metal oxide material of the seal material 125 may be selected to exhibit a substantially similar etch rate to the other exposed materials to be removed during later process acts. The seal material 125 is selected so that a portion of the seal material 125 may be removed at a relatively fast etch rate with a high etch selectivity than other exposed materials. By increasing or decreasing the silicon content of the seal material 125, the etch rate and etch rate selectivity of the seal material 125 may be tailored. By way of example only, the metal silicate exhibits a faster etch rate and a more closely matched (e.g., similar) etch rate to that of the other exposed materials than that of the corresponding metal oxide when exposed to the same dry etch conditions. Therefore, the metal silicate may be selected as the seal material 125 rather than the corresponding metal oxide when faster etching is desired. Alternatively, the amount of silicon in the seal material in the seal material 125 may be increased or decreased to tailor the etch selectivity. The seal material 125 and the hardmask material may exhibit similar etch rates and etch rate selectivities so that the seal material 125 and the hardmask material may be removed substantially simultaneously during subsequent process acts.

The seal material 125 according to embodiments of the disclosure may be formed by a conformal process, such as by an atomic layer deposition (ALD) process that is less aggressive than conventional techniques of forming silicon nitride and silicon oxide of conventional PECVD SiN/PEALD SiO$_x$ seal materials. The ALD process according to embodiments of the disclosure may be conducted at a lower temperature than conventional ALD processes of forming the metal oxide or metal silicate for use in other applications. By way of example only, the ALD process may be conducted at a temperature less than or equal to about 225° C., which is significantly lower than a temperature of 275° C. or higher for a conventional ALD process of forming the metal oxide or metal silicate. The temperature may be sufficient to react a metal precursor with an oxidizing agent to form the metal oxide material. By way of example only, the ALD process may be conducted at a temperature of between about 100° C. and 225° C., between about 120° C. and 225° C., between about 140° C. and 200° C., between about 140° C. and 190° C., between about 140° C. and 180° C., between about 140° C. and 170° C., between about 140° C. and 160° C., between about 140° C. and 155° C., between about 145° C. and 170° C., between about 145° C. and 160° C., between about 145° C. and 155° C., between about 140° C. and 170° C., between about 140° C. and 160° C., between about 145° C. and 165° C., or between about 145° C. and 155° C. In some embodiments, the ALD process is conducted at about 150° C. The seal material 125 is, therefore, formed by a thermal ALD process and not by a plasma enhanced (PE) ALD process. Reducing or substantially eliminating exposure of the materials of the stacks 105 to plasma conditions may reduce or substantially eliminate oxidation of the sensitive materials of the stacks 105. Forming the seal material 125 by the low temperature ALD process may substantially reduce or eliminate damage to the sensitive materials of the stacks 105 compared to the temperatures used in conventional processes of forming PECVD SiN/PEALD SiO$_x$ seal materials.

The ALD process of forming the seal material 125 may also utilize a less reactive chemistry than conventional ALD processes, such as by using a less reactive oxidizing agent. The oxidizing agent may, for example, be water, hydrogen peroxide, oxygen gas (O$_2$), or a combination thereof. In some embodiments, the oxidizing agent is water. By utilizing water as the oxidizing agent, damage to the sensitive materials of the stacks 105 may be substantially reduced or eliminated compared to conventional processes of forming PECVD SiN/PEALD SiO$_x$ seal materials, which use stronger oxidizing agents. Utilizing water as the oxidizing agent may also cause less damage to other exposed materials than utilizing ozone or oxygen-containing plasmas.

If the seal material 125 is the metal oxide, the ALD process may utilize a conventional metal ALD precursor of the desired metal including, but not limited to, an aluminum ALD precursor, a hafnium ALD precursor, a zirconium ALD precursor, or a combination thereof. As known in the art, the metal ALD precursor are reacted with the oxidizing agent to form the metal oxide on the stack structures 100. The metal ALD precursor and the oxidizing agent (e.g., water) may be selected to be sufficiently reactive with each other to react under the low temperature process conditions to form the seal material 125. The metal ALD precursor and the oxidizing agent (e.g., water) may be sufficiently reactive with one another that plasma conditions are not used.

If the seal material 125 is the metal silicate, the ALD process may utilize one of the previously mentioned conventional metal ALD precursors and a conventional silicon ALD precursor. As known in the art, the metal ALD precursor, the silicon ALD precursor, and the oxidizing agent (e.g., water) are reacted to form the metal silicate as the seal material 125. The metal ALD precursor, the silicon ALD precursor, and the oxidizing agent (e.g., water) may be selected to be sufficiently reactive with one another to react under the low temperature process conditions to form the seal material 125. The metal ALD precursor, the silicon ALD precursor, and the oxidizing agent (e.g., water) may be sufficiently reactive with one another that plasma conditions are not used.

To form the metal oxide as the seal material 125, the stack structure 100 including the stacks 105 and liners 110A, 110B, if present, may be placed into a conventional ALD chamber and the metal precursor and oxidizing agent sequentially introduced into the ALD chamber as known in the art. Cycles of the metal precursor and oxidizing agent may be repeated until the desired thickness of the metal oxide is achieved. To form the metal silicate as the seal material 125, the stack structure 100 including the stacks 105 and liners 110A, 110B, if present, may be placed into the ALD chamber and the metal precursor, the silicon ALD precursor, and oxidizing agent sequentially introduced into the ALD chamber as known in the art. Cycles of the metal precursor, the silicon ALD precursor, and the oxidizing agent may be repeated until the desired thickness of the metal silicate is achieved. ALD precursors, ALD processes, and ALD chambers are known in the art and, therefore, are not discussed in detail herein.

The stack structure 100 may also include a cap 135 on an upper surface of the seal material 125, as shown in FIGS. 2A and 2B. The cap 135 may be formed on the seal material 125 in situ or ex situ. A thickness of the cap 135 relative to the thickness of the seal material 125 is exaggerated in FIGS. 2A and 2B for illustration purposes. The cap 135 may provide improved interface properties between the seal material 125 and the subsequently formed fill material 140 (see FIG. 3), enabling the fill material 140 to be formed in the openings 115' without forming voids. The cap 135 may, for example, be a high quality silicon oxide material. The cap 135 may be formed over the seal material 125 by an ALD process, such as by a low temperature ALD process or by a PEALD process. The cap 135 may be highly conformal and exhibit a high degree of thickness uniformity. In some embodiments, the cap 135 is a silicon oxide material and is formed in situ by a thermal ALD process. If the metal oxide is used as the seal material 125, the silicon oxide material of the cap 135 may be formed in situ over the metal oxide. The cap 135 may be formed by sequentially introducing the silicon ALD precursor and the oxidizing agent (e.g., water) to the ALD chamber at the end of the thermal ALD process that forms the seal material 125. Ozone may also be used as the oxidizing agent to form the cap 135 since the seal material 125 already protects the underlying materials from damage. The sequential introduction of the silicon ALD precursor and water may be conducted until a desired thickness of the cap 135 is achieved. If the metal silicate is used as the seal material 125, the silicon oxide material of the cap 135 may be formed in situ over the metal silicate by sequentially introducing only the silicon ALD precursor and water at the end of the thermal ALD process that forms the seal material 125. The ALD process may terminate with a cycle of the silicon ALD precursor and water, which are used to form the metal silicate. The sequential introduction of the silicon ALD precursor and water may be conducted until a desired thickness of the cap 135 is achieved.

In other embodiments, the cap 135 is a silicon oxide material that is formed ex situ by a PEALD process. The cap 135 may be formed ex situ over the seal material 125 by sequentially introducing the silicon ALD precursor and the oxidizing agent under plasma conditions to the ALD chamber after forming the seal material 125. The sequential introduction of the silicon ALD precursor and the oxidizing agent may be conducted until a desired thickness of the cap 135 is achieved. Since the seal material 125 is already formed over the stacks 105, the plasma conditions do not oxidize or otherwise damage the materials of the stacks 105.

Figure 3:
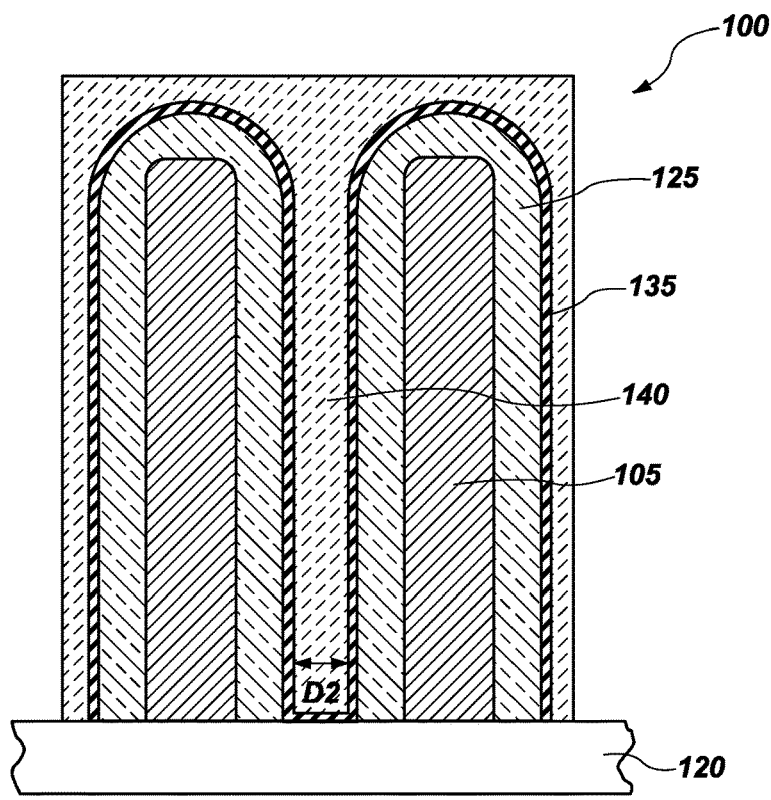

The fill material 140 may be formed in the openings 115' between the adjacent stacks 105, as shown in FIG. 3. The fill material 140 may, for example, be an electrically insulative material, such as a dielectric material. The fill material 140 may be a partially sacrificial material in that the fill material 140 is subsequently partially removed prior to completion of the electronic device that includes the stack structure 100. The fill material 140 may, for example, be partially removed prior to completion of a first deck of the electronic device. Alternatively, the fill material 140 may be present in the electronic device that includes the stack structure 100. The fill material 140 may, for example, be silicon dioxide, silicon nitride, silicon oxynitride, silicon oxycarbide, a spin-on dielectric material (SOD), BPSG, BSG, an air gap, or another dielectric material. In some embodiments, the fill material 140 is a spin-on silicon dioxide. In other embodiments, the fill material 140 is a high quality, silicon dioxide.

However, other fill materials 140 may be used, such as by forming an air gap between the adjacent stacks 105. Since the seal material 125 according to embodiments of the disclosure does not produce bottlenecks or bread loafing, the fill material 140 may substantially completely fill the openings 115', as shown in FIG. 3. The openings 115' may be substantially completely filled without forming voids in the fill material 140. Excess fill material 140 over the stacks 105 may subsequently be removed, such as by chemical mechanical planarization (CMP). In addition, the seal material 125 and the cap 135 may be removed from upper surfaces of the stacks 105, exposing the hardmask material or an electrode material of the stacks 105. However, the seal material 125 and the cap 135 remain on the sidewalls of the stacks 105. If the fill material 140 is a dielectric material, the dielectric material may isolate memory cells of the electronic device from one another and may also provide mechanical support during subsequent process acts to form the electronic device.

Figure 4:
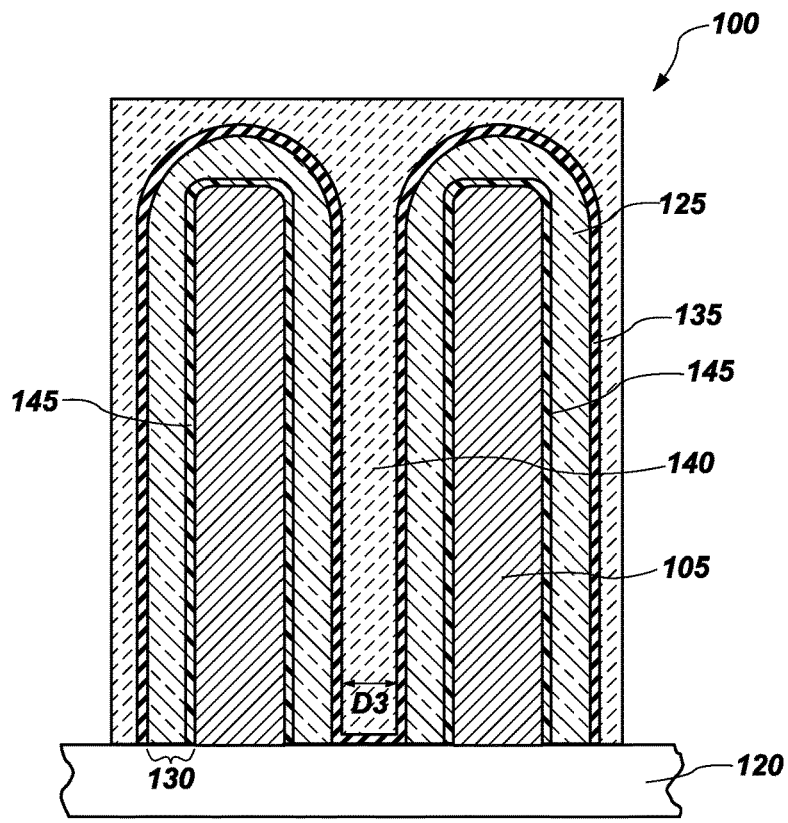

While the seal material 125 has been described as including a material of a single chemical composition, two or more materials that differ in chemical composition or in relative amounts of the chemical elements in a single chemical composition may be used as a seal structure 130. The seal material 125 may also be a single chemical composition that includes a gradient of one of the chemical elements. The seal structure 130 includes the seal material 125 in combination with one or more additional materials. For example, the seal structure 130 may include two materials having different chemical compositions, such as the seal material 125 and a silicon nitride material 145, as shown in FIG. 4. The seal structure 130 does not include (e.g., excludes) silicon oxide. The silicon nitride material 145 may be formed over the stacks 105 by, for example, PECVD and the seal material 125 may be formed over the silicon nitride material 145 as discussed above in relation to FIGS. 1A-3. The silicon nitride material 145 may be formed to a desired thickness before conducting the thermal ALD process to form the seal material 125 according to embodiments of the disclosure. The cap 135 may then be formed over the seal material 125 of the seal structure 130. The silicon nitride material 145, the seal material 125, and the cap 135 may be conformally formed over the stacks 105 and optional liners 110A, 110B and in the openings 115, reducing the size of the openings 115'. The stacks 105 of the stack structure 100 including the seal structure 130 may be separated from one another by a distance D3, which is less than the distance D1. The distance D3 is also less than the distance D2 since the spacing between the adjacent stacks 105 includes the combined thickness of the silicon nitride material 145, the seal material 125, and the cap 135. The fill material 140 is formed in the openings 115' between the adjacent stacks 105 as discussed above in relation to FIG. 3. The distance D3 may be sufficient for the fill material 140 to be formed in the openings 115' without forming voids in the fill material 140. Therefore, the stack structure 100 may include two materials (e.g., the silicon nitride material 145 and the metal oxide material 125) having different chemical compositions over the stacks 105, as shown in FIG. 4. The seal structure 130 may be used with or without the liners 110A, 110B.

The seal material 125 or the seal structure 130 according to embodiments of the disclosure provides barrier properties at a low thickness, enabling the seal material 125 to be formed without causing bread-loafing between adjacent stacks 105. Since the process conditions for forming the seal material 125 are less aggressive than the process conditions for forming conventional PECVD SiN/PEALD $SiO_x$ seal materials, the formation of the seal material 125 according to embodiments of the disclosure does not damage or otherwise affect materials of the stack 105, such as the chalcogenide material or carbon material, even when the seal material 125 is formed directly on the materials of the stacks 105. Therefore, loss of the chalcogenide material may be substantially reduced or eliminated compared to the chalcogenide loss observed with conventional PECVD SiN/PEALD $SiO_x$ seal materials. The chalcogenide loss observed with the seal material 125 or the seal structure 130 according to embodiments of the disclosure is about 0% while the chalcogenide loss observed with conventional PECVD SiN/PEALD $SiO_x$ seal materials is between about 4% and 30%, such as between about 4% and 10%.

If the stack structure 100 includes the seal material 125 according to embodiments of the disclosure and the cap 135 formed by an in situ process, the materials of the stacks 105 may be encapsulated and protected from oxidation by a single material i.e., the seal material 125. If the seal material 125 is formed by a thermal ALD process, the materials of the stacks 105 are not exposed to plasma conditions, which decreases damage to the stacks 105. The seal material 125 according to embodiments of the disclosure may also be formed by a more cost effective process than that of conventional SiN/$SiO_x$ seal materials since expensive densification acts are eliminated. By forming the cap 135 over the seal material 125 by an in situ process, the formation of a PEALD $SiO_x$ material is eliminated compared to processes of forming the conventional PECVD SiN/PEALD $SiO_x$ seal material, which further reduces costs and improves integration.

If the stack structure 100 includes the seal structure 130 (e.g., the silicon nitride material 145 and the seal material 125) and the cap 135 formed by an in situ process, the stacks 105 may be encapsulated and its materials protected from oxidation by multiple materials, such as a bilayer of materials. By forming the cap 135 over the seal structure 130 by an in situ process, such as the thermal ALD process, the formation of a PEALD $SiO_x$ material is eliminated compared to processes of forming the conventional PECVD SiN/PEALD $SiO_x$ seal materials, which further reduces costs and improves integration.

If the stack structure 100 includes the silicon nitride material 145, the seal material 125, and the cap 135 formed by an ex situ process, the stacks 105 may be encapsulated and its materials protected from oxidation by the seal structure 130 that includes multiple materials. By forming the cap 135 over the seal structure 130 by an ex situ process, such as by PEALD, the thickness of the seal material 125 relative to the thickness of the silicon nitride material 145 may be tailored to achieve the desired barrier properties of the seal structure 130. For a desired total thickness of the seal structure 130, the thickness of the seal material 125 may be increased or decreased relative to the thickness of the silicon nitride material 145 to achieve the desired barrier properties of the seal structure 130. The PEALD process may also enable the cap 135 to be formed at an increased thickness.

Figure 5:
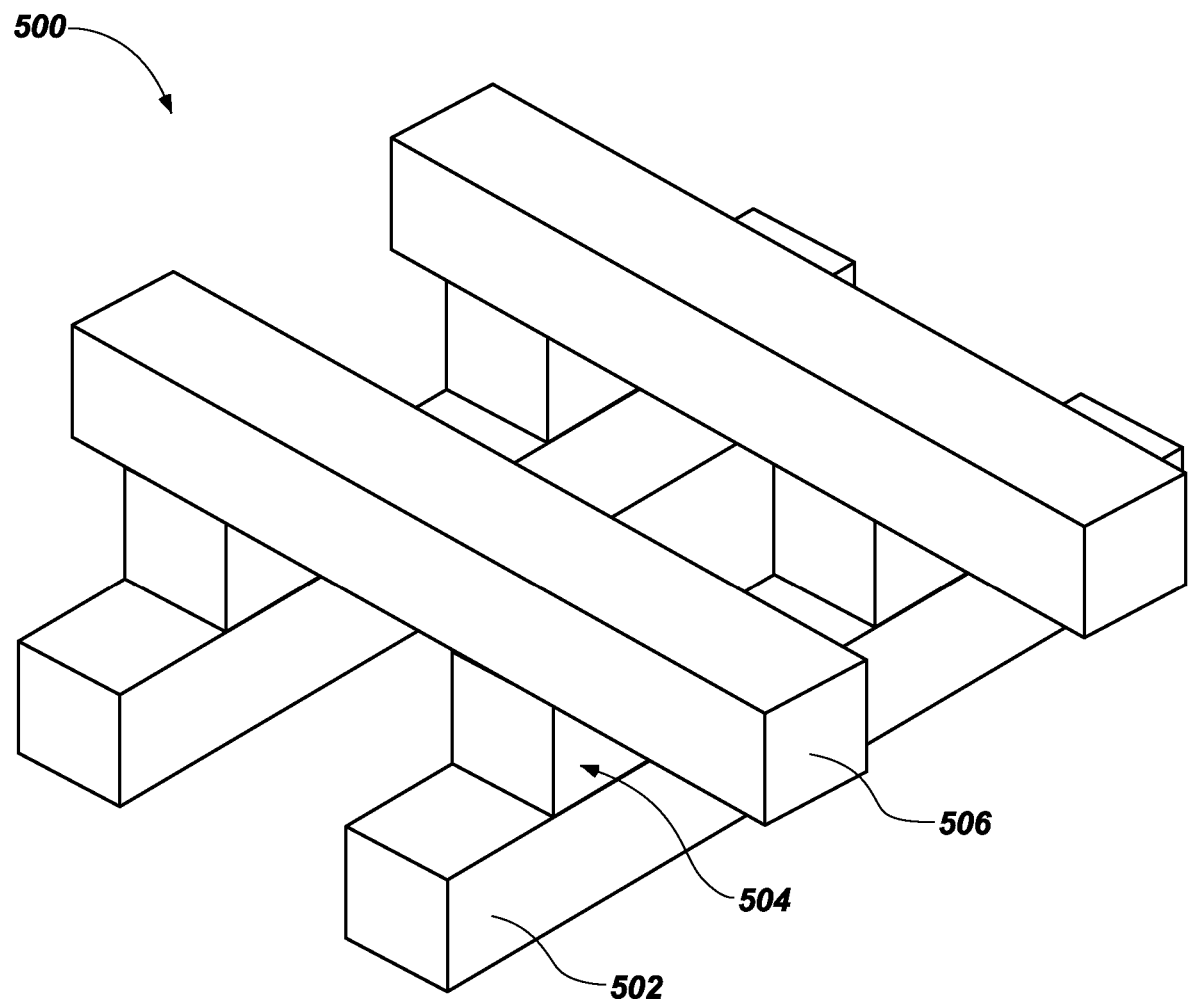
FIG. 5 is a perspective view of an array of memory cells including stack structures according to embodiments of the disclosure.

During subsequent process acts, the hardmask material of the stacks 105 may be removed by conventional techniques and another conductive material (e.g., electrically conductive material) formed over the remaining materials of the stacks 105. The another conductive material may be patterned by conventional techniques to form, for example, a bit line (e.g., a digit line) or contact over the stack structure 100. The another conductive material may directly contact the conductive material of the stacks 105, such as a conductive material configured as an electrode of the stacks 105. As shown in FIG. 5 and described below, the another conductive material may be configured as a bit line 506 (e.g., a digit line) of the electronic device that includes the stack structure 100. The electronic device may include multiple memory cells 504 arranged in rows and columns and that include the stack structure 100, with each memory cell 504 isolated (e.g., electrically isolated) from other memory cell 504 by the seal material 125 and the fill material 140 of the stack structure 100.

Accordingly, an electronic device that comprises a stack structure comprising one or more stacks of materials and a metal oxide material adjacent to the one or more stacks of materials is disclosed. The materials of the one or more stacks comprise one or more chalcogenide materials. The metal oxide material comprises aluminum oxide, aluminum silicate, hafnium oxide, hafnium silicate, zirconium oxide, zirconium silicate, or a combination thereof and the metal oxide material extends continuously from an upper portion of the one or more stacks of materials to a lower portion of the one or more stacks of materials.

Accordingly, an electronic device that comprises a stack structure comprising one or more stacks of materials and a metal oxide material adjacent to the one or more stacks of materials is disclosed. The materials of the one or more stacks comprise one or more chalcogenide materials. The metal oxide material comprises aluminum silicate, a transition metal silicate, or a combination thereof.

Accordingly, a method of forming an electronic device is disclosed. The method comprises forming stacks of materials comprising one or more chalcogenide materials. A metal oxide material is formed adjacent to the stacks of materials by atomic layer deposition. A fill material is formed adjacent to the metal oxide material and between adjacent stacks of the materials, the fill material substantially free of voids.

Additional processing acts may be conducted to form the electronic device that includes an array 500 of memory cells 504, which include the stack structure 100 according to embodiments of the disclosure, as shown in FIG. 5. The subsequent process acts are conducted by conventional techniques, which are not described in detail herein. The memory cells 504 including the stack structure 100 may be positioned between access lines 502 (e.g., word lines) and bit lines 506 (e.g., digit lines). The access lines 502 may be in electrical contact with, for example, the tungsten material of the stacks 105 or an electrode (e.g., a bottom electrode) and the bit lines 506 may be in electrical contact with another electrode (e.g., a top electrode) of the stacks 105. The bit lines 506 may directly overlie a row or column of the memory cells 504 including the stack structure 100 and contact the top electrode thereof. Each of the access lines 502 may extend in a first direction and may connect a row of the memory cells 504 (e.g., phase change memory cells). Each of the bit lines 506 may extend in a second direction that is at least substantially perpendicular to the first direction and may connect a column of the memory cells 504. A voltage applied to the access lines 502 and the bit lines 506 may be controlled such that an electric field may be selectively applied at an intersection of at least one access line 502 and at least one bit line 506, enabling the memory cells 504 including the stack structure 100 according to embodiments of the disclosure to be selectively operated.

Accordingly, an electronic device is disclosed. The electronic device comprises an array of memory cells and access lines and bit lines electrically coupled to the memory cells. The memory cells comprise stacks of materials comprising one or more chalcogenide materials. A seal structure is directly adjacent to the stacks of materials and comprises a silicon nitride material adjacent to the stacks and a metal oxide material adjacent to the silicon nitride material.

Figure 6:
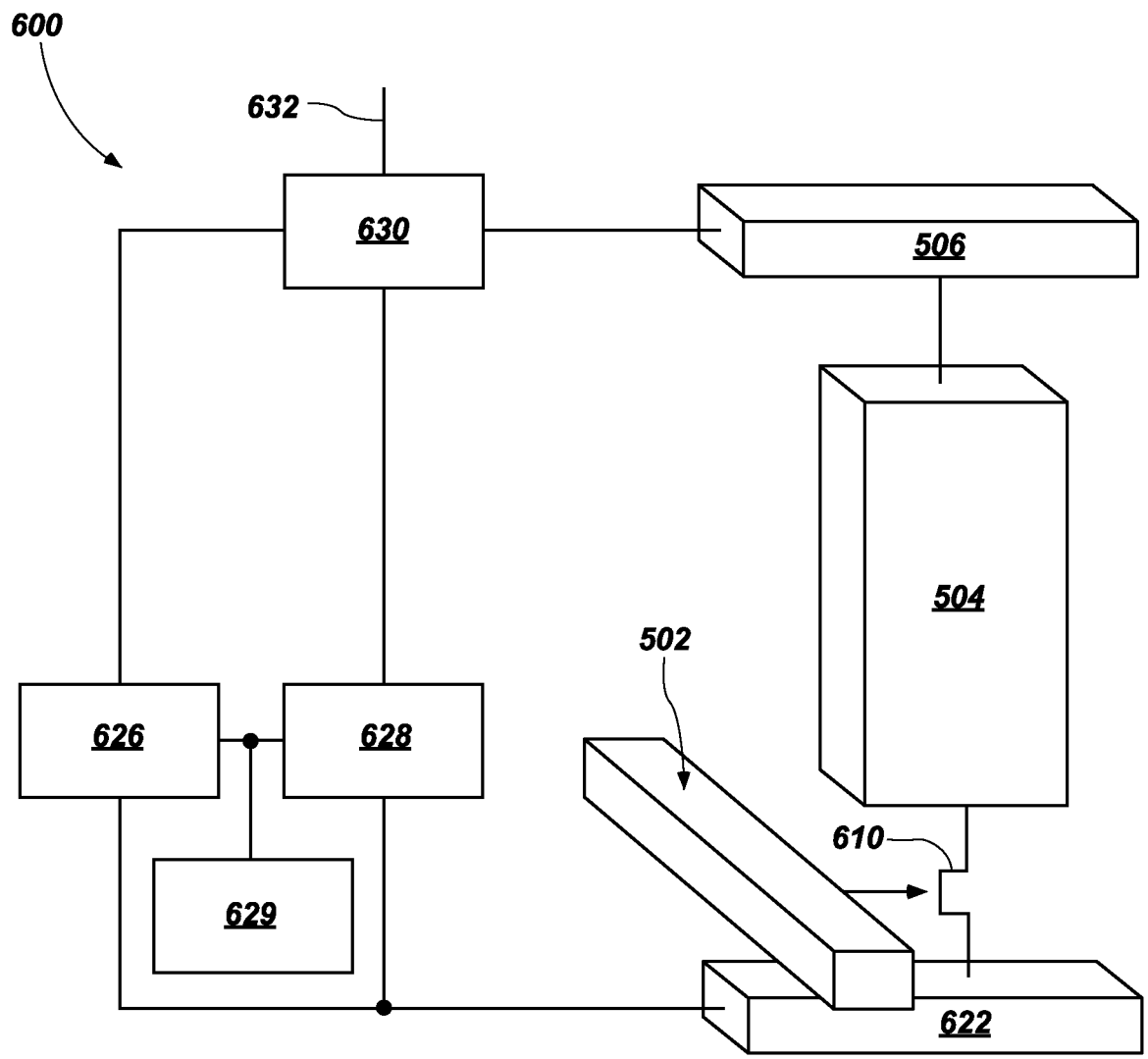
FIG. 6 is a functional block diagram of an electronic device including stack structures according to embodiments of the disclosure.

An electronic device 600 (e.g., a PCRAM memory device) according to embodiments of the disclosure is shown schematically in the functional block diagram of FIG. 6. The electronic device 600 may include at least one memory cell 504 between at least one bit line 506 and at least one source line 622. The memory cell 504 may be substantially similar to the memory cell 504 described above with reference to FIG. 5. The memory cell 504 may be coupled to an access device 610. The access device 610 may act as a switch for enabling and disabling current flow through the memory cell 504. By way of non-limiting example, the access device 610 may be a transistor (e.g., a field-effect transistor, a bipolar junction transistor, etc.) with a gate connected to an access line, for example, the access line 502. The access line 502 may extend in a direction substantially perpendicular to that of the bit line 506. The bit line 506 and the source line 622 may be connected to logic for programming and reading the memory cell 504. A control multiplexer 630 may have an output connected to the bit line 506. The control multiplexer 630 may be controlled by a control logic line 632 to select between a first input connected to a pulse generator 626, and a second input connection to read-sensing logic 628.

During a programming operation, a voltage greater than a threshold voltage of the access device 610 may be applied to the access line 502 to turn on the access device 610. Turning on the access device 610 completes a circuit between the source line 622 and the bit line 506 by way of the memory cell 504. After turning on the access device 610, a bias generator 629 may establish, by way of the pulse generator 626, a bias voltage potential difference between the bit line 506 and the source line 622. During a read operation, the bias generator 629 may establish, by way of the read-sensing logic 628, a read bias voltage potential difference between the bit line 506 and the source line 622. The read bias voltage may be lower than the reset bias voltage. The read bias voltage enables current to flow through the memory cell 504. For example, for a given read bias voltage, if the chalcogenide material of the stacks 105 is in a high-resistance state (e.g., a reset state), a relatively smaller current flows through the memory cell 504 than if the chalcogenide material of the stacks 105 is in a low-resistance state (e.g., a set state). The amount of current flowing through the memory cell 504 during the read operation may be compared to a reference input by the read-sensing logic 628 (e.g., a sense amplifier) to discriminate whether the data stored in the memory cell 504 is a logic "1" or a logic "0." In some embodiments, the source line 622 may coincide with the access line 502 and the access device 610 may not be present. The pulse generator 626 and read-sensing logic 620 may bias the access line 502 at a voltage sufficient for the memory cell 504 to self-select.

Figure 7:
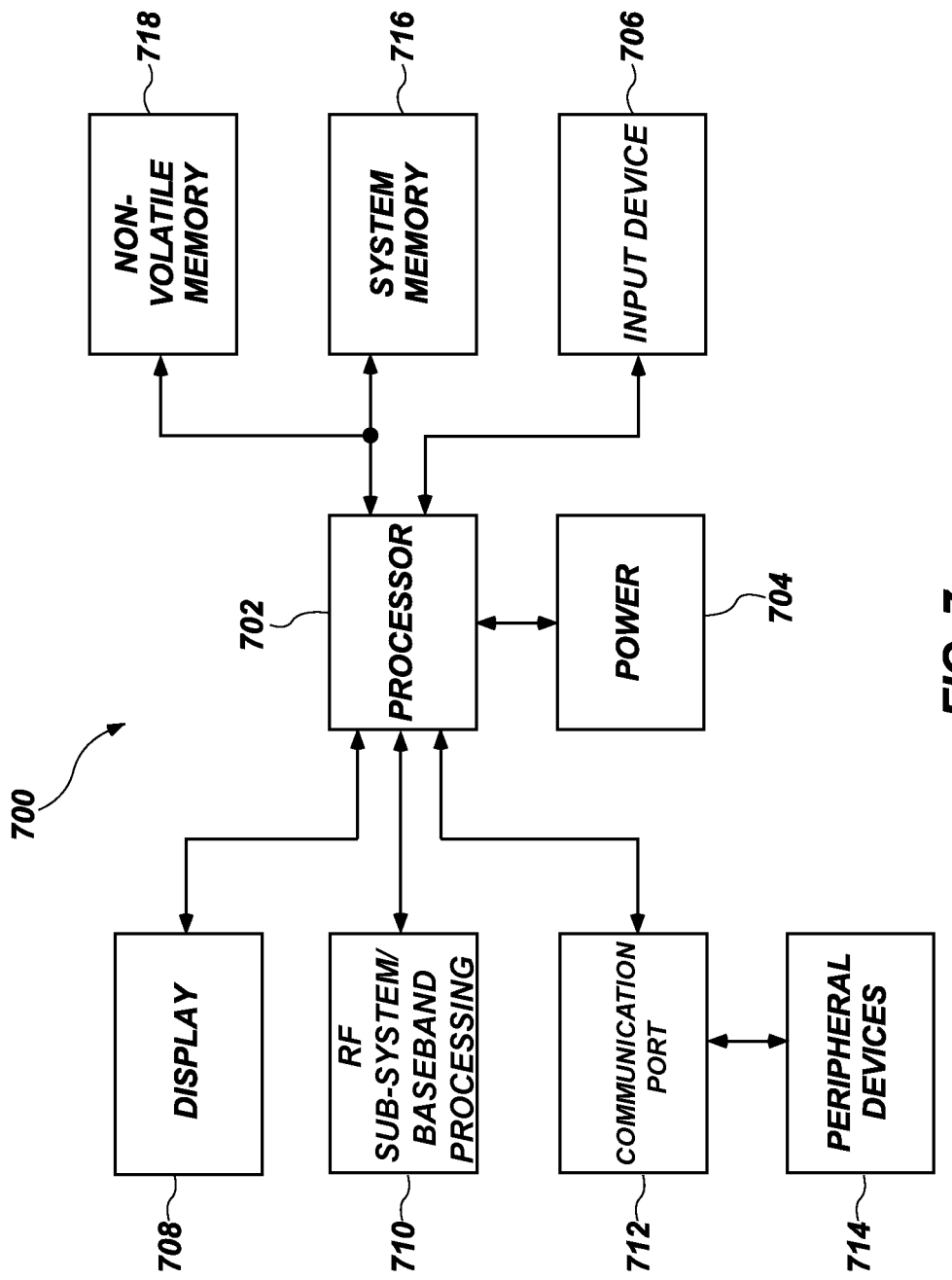
FIG. 7 is a simplified block diagram of a system including stack structures according to embodiments of the disclosure.

A system 700 is also disclosed, as shown in FIG. 7, and includes the memory cells 504 according to embodiments of the disclosure. FIG. 7 is a simplified block diagram of the system 700 implemented according to one or more embodiments described herein. The system 700 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The system 700 includes at least one electronic device 600, which includes memory cells 504 including the stack structure 100 as previously described. The system 700 may further include at least one processor 702, such as a microprocessor, to control the processing of system functions and requests in the system 700. The processor 702 and other subcomponents of the system 700 may include memory cells 504 according to embodiments of the disclosure. The processor 702 may, optionally, include one or more electronic devices 600 as previously described.

The system 700 may include a power supply 704 in operable communication with the processor 702. For example, if the system 700 is a portable system, the power supply 704 may include one or more of a fuel cell, a power scavenging device, permanent batteries, replaceable batteries, and rechargeable batteries. The power supply 704 may also include an AC adapter. Therefore, the system 700 may be plugged into a wall outlet, for example. The power supply 704 may also include a DC adapter such that the system 700 may be plugged into a vehicle cigarette lighter or a vehicle power port, for example.

Various other devices may be coupled to the processor 702 depending on the functions that the system 700 performs. For example, an input device 706 may be coupled to the processor 702. The input device 706 may include input devices such as buttons, switches, a keyboard, a light pen, a mouse, a digitizer and stylus, a touch screen, a voice recognition system, a microphone, or a combination thereof. A display 708 may also be coupled to the processor 702. The display 708 may include an LCD display, an SED display, a CRT display, a DLP display, a plasma display, an OLED display, an LED display, a three-dimensional projection, an audio display, or a combination thereof. Furthermore, an RF sub-system/baseband processor 710 may also be coupled to the processor 702. The RF sub-system/baseband processor 710 may include an antenna that is coupled to an RF receiver and to an RF transmitter (not shown). A communication port 712, or more than one communication port 712, may also be coupled to the processor 702. The communication port 712 may be adapted to be coupled to one or more peripheral devices 714, such as a modem, a printer, a computer, a scanner, or a camera, or to a network, such as a local area network, remote area network, intranet, or the Internet, for example.

The processor 702 may control the system 700 by implementing software programs stored in the memory. The software programs may include an operating system, database software, drafting software, word processing software, media editing software, or media playing software, for example. The memory is operably coupled to the processor 702 to store and facilitate execution of various programs. For example, the processor 702 may be coupled to system memory 716, which may include phase change random access memory (PCRAM) and other known memory types. The system memory 716 may include volatile memory, non-volatile memory, or a combination thereof. The system memory 716 is typically large so that it can store dynamically loaded applications and data. In some embodiments, the system memory 716 may include electronic devices, such as the electronic device 600 of FIG. 6, and memory cells, such as the memory cell 504 described above with reference to FIG. 5.

The processor 702 may also be coupled to non-volatile memory 718, which is not to suggest that system memory 716 is necessarily volatile. The non-volatile memory 718 may include PCRAM to be used in conjunction with the system memory 716. The size of the non-volatile memory 718 is typically selected to be just large enough to store any necessary operating system, application programs, and fixed data. Additionally, the non-volatile memory 718 may include a high capacity memory such as disk drive memory, such as a hybrid-drive including resistive memory or other types of non-volatile solid-state memory, for example. The non-volatile memory 718 may include electronic devices, such as the electronic device 600 of FIG. 6, and memory cells, such as the memory cell 504 described above with reference to FIG. 5.

Accordingly, a system comprising a processor and an electronic device operably coupled to the processor is disclosed. The electronic device comprises memory cells that comprise stacks of materials comprising one or more chalcogenide materials and a metal oxide material adjacent to the stacks of materials. The metal oxide material comprises a metal oxide or a metal silicate and the metal comprises aluminum or a transition metal. The metal oxide material formulated to hermetically seal the stacks of materials. The processor is operably coupled to an input device and an output device.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. An electronic device comprising:
a stack structure comprising one or more stacks of materials, the materials of the one or more stacks comprising one or more chalcogenide materials;
a metal oxide material adjacent to the one or more stacks of materials, the metal oxide material comprising aluminum oxide, aluminum silicate, hafnium oxide, hafnium silicate, zirconium oxide, zirconium silicate, or a combination thereof and the metal oxide material extending continuously from an upper portion of the one or more stacks of materials to a lower portion of the one or more stacks of materials;
a cap on a first surface of the metal oxide material, the cap exhibiting a uniform thickness on the first surface of the metal oxide material; and
a liner between the one or more stacks of materials and the metal oxide material.

2. The electronic device of claim 1, further comprising a fill material in direct contact with the cap.

3. The electronic device of claim 1, wherein the metal oxide material is in direct contact with the liner on the one or more stacks.

4. The electronic device of claim 1, wherein the liner is in direct contact with a second surface of the metal oxide material.

5. The electronic device of claim 1, wherein adjacent stacks are spaced at a half pitch of from about 10 nm to about 30 nm.

6. An electronic device comprising:
a stack structure comprising one or more stacks of materials, the materials of the one or more stacks comprising one or more chalcogenide materials;

a liner material directly vertically adjacent to the one or more stacks;

a metal oxide material directly vertically adjacent to the liner material, the metal oxide material comprising a metal silicate comprising aluminum silicate, a transition metal silicate, or a combination thereof; and a cap on sidewalls and an upper portion of the metal oxide material.

7. The electronic device of claim 6, wherein the metal oxide material comprises a thickness of from about 1.0 nm to about 2.5 nm.

8. The electronic device of claim 6, wherein the one or more stacks further comprise one or more carbon materials.

9. The electronic device of claim 6, wherein the metal oxide material comprises from about 20 atomic percent to about 80 atomic percent of silicon.

10. An electronic device comprising:
an array of memory cells, the memory cells comprising:
stacks of materials comprising one or more chalcogenide materials;
a seal structure directly adjacent to the stacks of materials, the seal structure comprising a silicon nitride material adjacent to the stacks and a metal oxide material adjacent to the silicon nitride material, the metal oxide material comprising a metal silicate and the metal oxide material vertically adjacent to the stacks of materials;
a cap structure in direct contact with upper surfaces of the seal structure; and
access lines and bit lines electrically coupled to the memory cells.

11. The electronic device of claim 10, wherein the stacks comprise an aspect ratio of from about 10:1 to about 50:1.

12. The electronic device of claim 10, wherein the stacks comprise a single chalcogenide material.

13. The electronic device of claim 10, wherein the silicon nitride material is in direct contact with sidewalls of the stacks, the metal oxide material is in direct contact with sidewalls of the silicon nitride material, and the silicon nitride material and the metal oxide material are not present on an upper surface of the stacks.

14. The electronic device of claim 10, further comprising a conductive material in direct contact with a conductive material in an upper portion of the stacks and another conductive material in direct contact with a conductive material in a lower portion of the stacks.

15. The electronic device of claim 10, wherein the metal oxide material comprises aluminum hafnium silicate, aluminum zirconium silicate, or hafnium zirconium silicate.

16. A method of forming an electronic device, comprising:
forming a stack structure comprising one or more stacks of materials, the materials of the one or more stacks comprising one or more chalcogenide materials;
forming a metal oxide material adjacent to the one or more stacks of materials by atomic layer deposition (ALD), the metal oxide material comprising aluminum oxide, aluminum silicate, hafnium oxide, hafnium silicate, zirconium oxide, zirconium silicate, or a combination thereof and the metal oxide material extending continuously from an upper portion of the one or more stacks of materials to a lower portion of the one or more stacks of materials;
forming a liner between the one or more stacks of materials and the metal oxide material;
forming a cap on a first surface of the metal oxide material, the cap exhibiting a uniform thickness on the first surface of the metal oxide material; and
forming a fill material adjacent to the metal oxide material and between adjacent stacks of materials, the fill material substantially free of voids.

17. The method of claim 16, wherein forming one or more stacks of materials comprising one or more chalcogenide materials comprises forming the one or more stacks of materials comprising the one or more chalcogenide materials and one or more carbon materials.

18. The method of claim 16, wherein forming a metal oxide material adjacent to the one or more stacks of materials comprises conformally forming the metal oxide material at a temperature of between about 140° C. and 200° C.

19. The method of claim 16, wherein forming a metal oxide material adjacent to the one or more stacks of materials by ALD comprises forming the metal oxide material by reacting an aluminum ALD precursor, a zirconium ALD precursor, a hafnium ALD precursor, or a combination thereof and water.

20. The method of claim 16, wherein forming a fill material adjacent to the metal oxide material and between adjacent stacks of materials comprises completely filling openings between the adjacent stacks of materials with the fill material.

21. A system, comprising:
an input device;
an output device;
a processor operably coupled to the input device and the output device; and
an electronic device operably coupled to the processor, the electronic device comprising memory cells, the memory cells comprising:
stacks of materials comprising one or more chalcogenide materials;
a metal oxide material adjacent to the stacks of materials, the metal oxide material comprising a metal silicate and the metal comprising aluminum or a transition metal, and the metal oxide material formulated to hermetically seal the stacks of materials; and
a cap structure directly contacting an entirety of upper surfaces of the metal oxide material.

22. The system of claim 21, further comprising a silicon nitride material between the metal silicate material and the stacks of materials.

* * * * *